United States Patent
Amit et al.

(10) Patent No.: US 9,947,113 B2
(45) Date of Patent: **\*Apr. 17, 2018**

(54) CONTROLLING REAL-TIME COMPRESSION DETECTION

(71) Applicant: INTERNATIONAL BUSINESS MACHINES CORPORATION, Armonk, NY (US)

(72) Inventors: Jonathan Amit, Omer (IL); Lilia Demidov, Nish-Tziona (IL); Yakov Gerlovin, Tel Aviv (IL); Nir Halowani, Holon (IL); Sergey Marenkov, Tel Aviv (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

This patent is subject to a terminal disclaimer.

(21) Appl. No.: 14/839,417

(22) Filed: Aug. 28, 2015

(65) Prior Publication Data

US 2015/0371406 A1    Dec. 24, 2015

Related U.S. Application Data

(63) Continuation of application No. 13/898,690, filed on May 21, 2013, now Pat. No. 9,147,374.

(51) Int. Cl.
*G06T 9/00* (2006.01)
*G09G 5/00* (2006.01)
(Continued)

(52) U.S. Cl.
CPC ............. *G06T 9/00* (2013.01); *G09G 5/00* (2013.01); *H03M 7/6064* (2013.01);
(Continued)

(58) Field of Classification Search
CPC  G06T 9/00; G06T 9/001; G06T 9/002; G06T 9/004; G06T 9/005; G06T 9/007;
(Continued)

(56) References Cited

U.S. PATENT DOCUMENTS 7,504,969 B2   3/2009  Patterson et al.
7,519,635 B1   4/2009  Haustein et al.
(Continued)

OTHER PUBLICATIONS

Lillibridge et al., "Sparse Indexing: Large Scale, Inline Deduplication Using Sampling and Locality", Proc. of the 7th Conference on File and Storage Technologies, USENIX, 2009.
(Continued)

*Primary Examiner* — Aaron W Carter
(74) *Attorney, Agent, or Firm* — Griffiths & Seaton PLLC (57) ABSTRACT

A detection learning module is used for enabling and/or disabling real-time compression detection by maintaining a history of real-time compression detection success for sampled data. The enabling or disabling of the real-time compression detection is based on a detection benefit function derived from a set of calculated heuristics indicating the real-time compression detection success on input streams. The detection benefit function is calculated based on at least one heuristic score.

24 Claims, 8 Drawing Sheets

(51) Int. Cl.
  *H04N 7/00* (2011.01)
  *H04N 13/00* (2018.01)
  *H03M 7/30* (2006.01)

(52) U.S. Cl.
  CPC ............ *H03M 7/6082* (2013.01); *H04N 7/00* (2013.01); *H04N 13/00* (2013.01)

(58) Field of Classification Search
  CPC .. G06T 9/008; G06T 9/20; G06T 9/40; H04N 1/00; H04N 19/00; H04N 1/17; H04N 7/26; H04N 1/41; H04N 1/4105; H04N 1/411; G06F 17/401; H03M 7/30
  USPC .................. 382/233–238, 240–244, 246–253
  See application file for complete search history.

(56) References Cited

U.S. PATENT DOCUMENTS

| | | | |
|---|---|---|---|
| 8,108,353 B2 | 1/2012 | Balachandran et al. | |
| 8,140,491 B2 | 3/2012 | Mandagere et al. | |
| 8,204,867 B2 | 6/2012 | Benhase et al. | |
| 8,560,508 B2 | 10/2013 | Amit et al. | |
| 9,588,980 B2 | 3/2017 | Amit et al. | |
| 2006/0294343 A1 | 12/2006 | Rejmaniak | |
| 2009/0204636 A1 | 8/2009 | Li et al. | |
| 2011/0285559 A1* | 11/2011 | Fallon | G06T 9/00 341/87 |
| 2012/0191670 A1 | 7/2012 | Kennedy et al. | |
| 2013/0254441 A1* | 9/2013 | Kipnis | H03M 7/30 710/68 |
| 2014/0195498 A1* | 7/2014 | Asher | H03M 7/4037 707/693 |

OTHER PUBLICATIONS

Costa et al., "Towards Automating the Configuration of a Distributed Storage System", pp. 201-208, 11th IEEE/ACM International Conference on Grid Computing, IEEE, 2010.

* cited by examiner

CONTROLLING REAL-TIME COMPRESSION DETECTION

CROSS-REFERENCE TO RELATED APPLICATIONS

This application is a Continuation of U.S. patent application Ser. No. 13/898,690, filed May 21, 2013, the contents of which are hereby incorporated by reference.

BACKGROUND OF THE INVENTION

Field of the Invention

The present invention relates in general to computers, and more particularly to controlling real-time compression detection in a computing environment.

Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components.

Column based compression, classification compression, and data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security.

SUMMARY OF THE DESCRIBED EMBODIMENTS

In one embodiment, a method is provided for controlling real-time compression detection using a processor device in a computing environment. A detection learning module is used for enabling and/or disabling real-time compression detection by maintaining a history of real-time compression detection success for sampled data. The enabling or disabling of the real-time compression detection is based on a detection benefit function derived from a set of calculated heuristics indicating the real-time compression detection success on input streams. The detection benefit function is calculated based on at least one heuristic score.

In another embodiment, a computer system is provided for controlling real-time compression detection in a computing environment. The computer system includes a computer-readable medium and a processor in operable communication with the computer-readable medium. The processor uses a detection learning module for enabling and/or disabling real-time compression detection by maintaining a history of real-time compression detection success for sampled data, and enables or disables the real-time compression detection based on a detection benefit function derived from a set of calculated heuristics indicating the real-time compression detection success on input streams. The detection benefit function is calculated based on at least one heuristic score.

In a further embodiment, a computer program product is provided for controlling real-time compression detection in a computing environment. The computer-readable storage medium has computer-readable program code portions stored thereon. The computer-readable program code portions include a first executable portions that uses a detection learning module for enabling and/or disabling real-time compression detection by maintaining a history of real-time compression detection success for sampled data. The enabling or disabling of the real-time compression detection is based on a detection benefit function derived from a set of calculated heuristics indicating the real-time compression detection success on input streams. The detection benefit function is calculated based on at least one heuristic score.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

As previously mentioned, computing systems are used to store and manage a variety of types of data. Compressing similar data using the same compression stream improves the compression ratio and reduces the required storage. For data that have an internal structure, e.g., tabular data or semi-structured data, separating sequences of data that belong to a class of data into separate compression streams improves the compression ratio. For example, when data is composed of interleaving sequences of text and numbers, compressing the text and numbers separately will provide a better compression ratio. A well-known technology for databases is column compression, where data stored in database tables is compressed column-wise (not row-wise), hence the notation of column compression, proving a better compression ratio, as data in a column is typically more similar than data between columns allowing the compression module to better exploit similarities and provide a better data reduction. The concept may be adapted to semi-structured data such as Hypertext Markup Language (HTML), Extensible Markup Language (XML), JavaScript Objected Notation (JSON), etc. By understanding the underlying structure of the data, each class of data may be identified and compressed—that is by using classification-based compression. Classification-based compression is a generalization of column compression, where the structure of the data is not strictly well-defined columns. In classification-based compression, the data of similar type is grouped together in the same compression stream. Classification-based compression allows for a smaller alphabet footprint, and assists in identifying repetitions that are further apart. These groups (e.g., the data of similar type that is grouped together in the same compression stream) can be called "virtual columns" in an analogy for column compression. However, not all data is structured or semi-structured, therefore, performing classification-based compression should be done on data which have a clear tabular or semi-tabular structure. For example, images, videos and encrypted or compressed data have no such tabular like structure.

In general, data compression methods consume a significant amount of computing resources (e.g., central processing units CPU"). Moreover, despite the various types of compression methods, some input data cannot be compressed to a significantly smaller output buffer, or the amount of CPU resources that are needed to achieve a meaningful compressed output is too high. For example, some compressed data will save very little space and/or may required too much time to compress and/or decompress. Thus, the present invention provides a solution to use a determination method (e.g., a predecide operation) before compressing data that detects the compressibility of sampled data and determines if a compression state and/or a store state should be used for the sampled data (e.g., a current write block). Therefore, along with data classification, a compression detection method may be used to determine data that cannot be compressed or that compression will reduce the data by a very small amount and skip compression for this data. Unfortunately, incorrect detection decisions can lead to significant compression reduction and storage system inefficiency, as further illustrated below in FIGS. 3 and 4.

Thus, the present invention provides a solution for controlling real-time compression detection using a processor device in a computing environment. A detection learning module is used for enabling and/or disabling real-time compression detection by maintaining a history of real-time compression detection success for sampled data. The enabling or disabling of the real-time compression detection is based on a detection benefit function derived from a set of calculated heuristics indicating the real-time compression detection success on input streams.

In one embodiment for data deduplication, present invention maintains a history of detection of deduplication success for sample data segments. If deduplication success drops (e.g., falls below a deduplication success threshold), the present invention will remove a false detection signature and disable the detection until it achieves a greater/better (e.g., increased) compression ratio. The signature is referred to as a histogram signature of data within range. Meaning N (Value in the range of N=1 . . . 256) most significant histogram character. So if two detection methods for a given stream has the same HS(n) (Histogram signature over N characters) then detection is not required and HS(n) detection is returned.

In one embodiment, the present invention consists of a detection learning mechanism responsible for enabling and/or disabling a compression detection method (e.g., a predecide operation for determining if data should be compressed and/or not compressed) based on how successful the compression detection method is for detecting whether data should be compressed or not compressed. The detection learning mechanism stores historical decision calls per small fragments of the input data, randomly selected, and computes a set of heuristics on the decision success rate. The decision to enable/disable the detect method is determined by the benefit function of the heuristics. In the context of a real-time compression, identifying detection success rate allow calibration of storage efficiency and storage space. In this way, the present invention incurs very little overhead before the actual detection/compression and provides an indication if the detection method should be used.

In one embodiment, a real-time compression detection operation (e.g., predecide compression detection operation or "predecide") is disabled if a detection benefit function indicates that the real-time compression detection success (e.g., a real-time compression detection success ratio) for the sampled data is below a detection success threshold. In one embodiment, the real-time compression detection operation (e.g., compression detection operation/method or "predecide") is enabled if a detection benefit function indicates that the real-time compression detection success (e.g., a real-time compression detection success ratio) for the sampled data is above the detection success threshold. In one embodiment, a real-time compression detection histogram is calculated on each sampled data segment, and a real-time compression detection interval is updated according to a real-time compression detection histogram. Each of the heuristics are calculated one after another and a heuristic score is computed for each of the calculated heuristics. In one embodiment a detection benefit function is calculated based on at least one heuristic score. The detection benefit function may be simplified such as if success rate drops below 50% then the detection benefit function returns a false detection and/or return a more complex detection benefit function such as add time factor, history of detection, histogram range, and the like.

In one embodiment, the detection learning module may always be used for providing an indication for either enabling and/or disabling the real-time compression detection for each real-time compression detection. In one embodiment, the detection learning module may be used on demand for performing either enabling and/or disabling real-time compression detection when a compression ratio is below a predetermined threshold for a predefined number of buffers and bytes. The detection learning module may be turned off when either all and/or a majority (e.g., at least 50% or more) of data is compressible. In one embodiment, the detection learning module may be used for either enabling and/or disabling the real-time compression detection (e.g., predecide compression detection operation or "predecide") according to either a buffer size and/or a set of buffer sizes.

Figure 1:
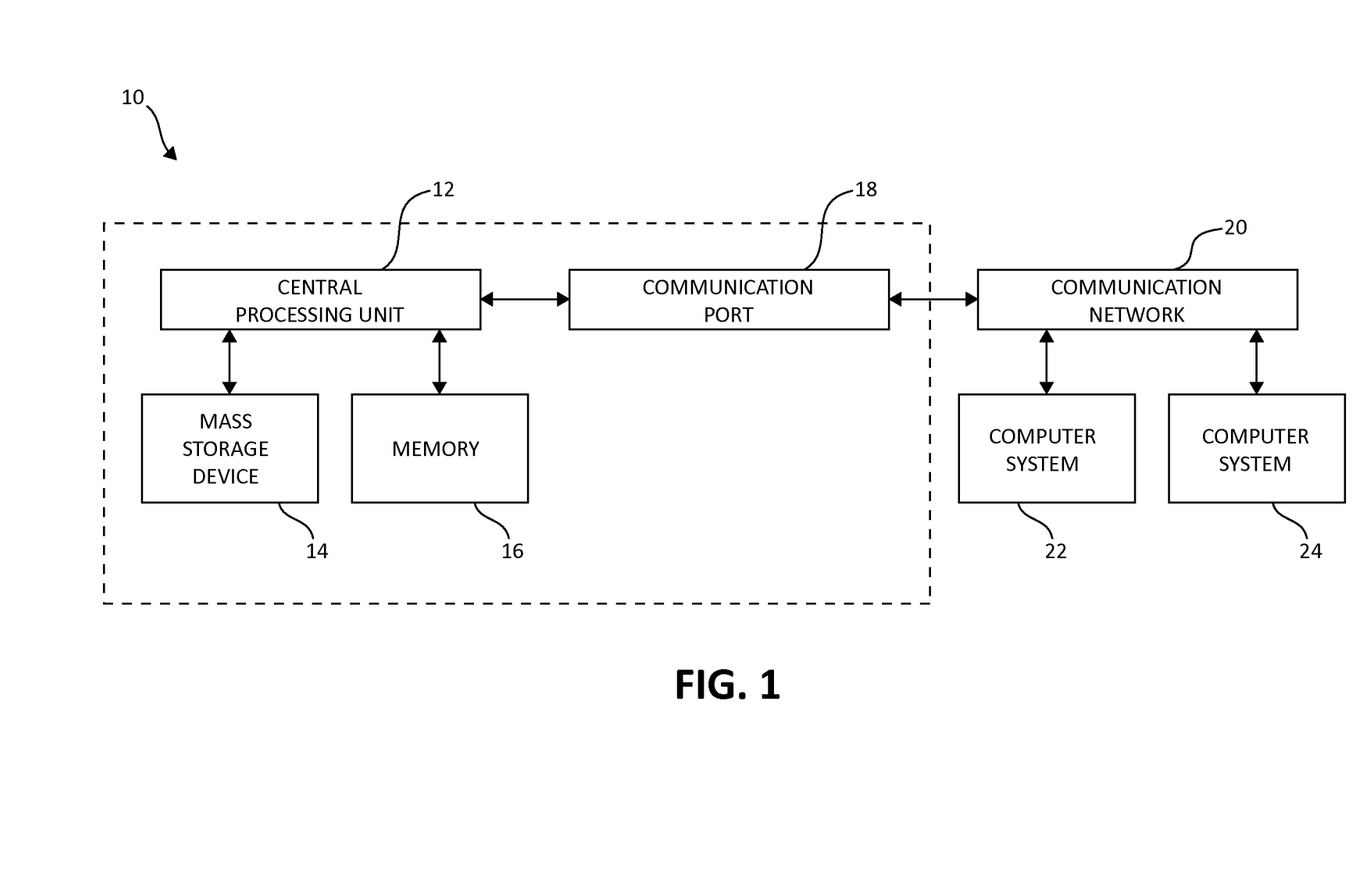
FIG. 1 is a block diagram illustrating a computer storage environment having an exemplary storage device in which aspects of the present invention may be realized.

Turning now to FIG. 1, exemplary architecture 10 of data storage systems in a computing environment is depicted. The computer system 10 includes central processing unit (CPU) 12, which is connected to mass storage device(s) 14 and memory device 16. Mass storage devices can include hard disk drive (HDD) devices, solid-state devices (SSD) etc., which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
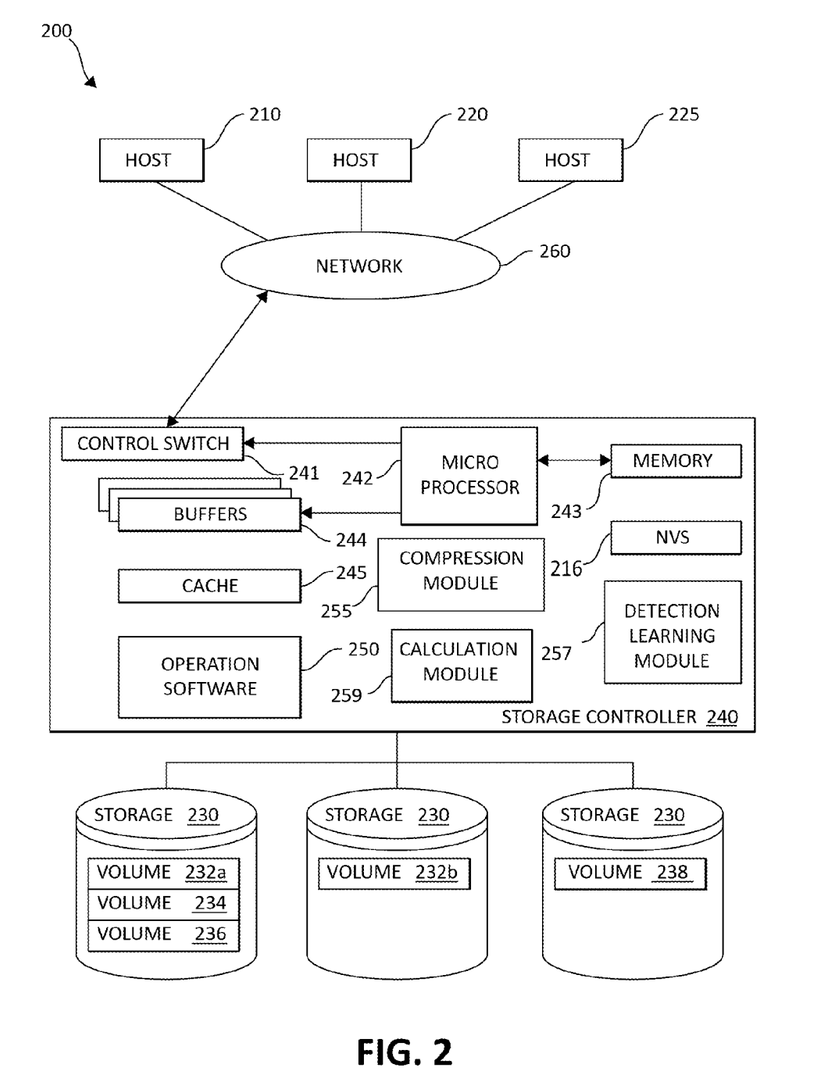
FIG. 2 is a block diagram illustrating a hardware structure of an exemplary data storage system in a computer system in which aspects of the present invention may be realized.

FIG. 2 is an exemplary block diagram 200 showing a hardware structure of a data storage system in a computer system according to the present invention. Referring to FIG. 2, there are shown host computers 210, 220, 225, each acting as a central processing unit for performing data processing a part of a data storage system 200. The hosts (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 1 comprising storage controller 240 and storage 230. In one embodiment, the embodiments described herein may be applicable to a variety of types of computing architectures, such as in a virtual cluster management environment using the various embodiments as described herein.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Storage 230 may be comprised of one or more storage devices, such as storage arrays, which are connected to storage controller 240 by a storage network.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps associated with managing storage 230 and executing the steps and methods of the present invention in a computer storage environment. In one embodiment, system memory 243 includes, is associated, or is in communication with the operation software 250 in a computer storage environment, including the methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the Cache 245 for any purposes suited to accomplish the objectives of the present invention. In some embodiments, a backup power source (not shown in FIG. 2), such a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a compression module 255, a detection learning module 257, and a calculation module 259 in a computer storage environment. The compression module 255, the detection learning module 257, and the calculation module 259 may work in conjunction with each and every component of the storage controller 240, the hosts 210, 220, 225, and storage devices 230. The compression module 255, the detection learning module 257, and the calculation module 259 may be structurally one complete module working together and in conjunction with each other for performing such functionality as described below, or may be individual modules. The compression module 255, the detection learning module 257, and the calculation module 259 may also be located in the cache 245 or other components of the storage controller 240 to accomplish the purposes of the present invention.

The storage controller 240 may be constructed with a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control and each table described later, cache 245 for temporarily storing (buffering) data, and buffers 244 for assisting the cache 245 to read and write data, a control switch 241 for controlling a protocol to control data transfer to or from the storage devices 230, compression module 255, the detection learning module 257, and the calculation module 259 on which information may be set. Multiple buffers 244 may be implemented with the present invention in a computing environment, or performing other functionality in accordance with the mechanisms of the illustrated embodiments.

In one embodiment, by way of example only, the host computers or one or more physical or virtual devices, 210, 220, 225 and the storage controller 240 are connected through a network adaptor (this could be a fiber channel) 260 as an interface i.e., via a switch sometimes referred to as "fabric." In one embodiment, by way of example only, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, compression module 255, the detection learning module 257, and the calculation module 259 are in communication with each other and may be separate or one individual component(s). Also, several, if not all of the components, such as the operation software 250 may be included with the memory 243 in a computer storage environment. Each of the components within the storage device may be linked together and may be in communication with each other for purposes suited to the present invention.

Figure 3:
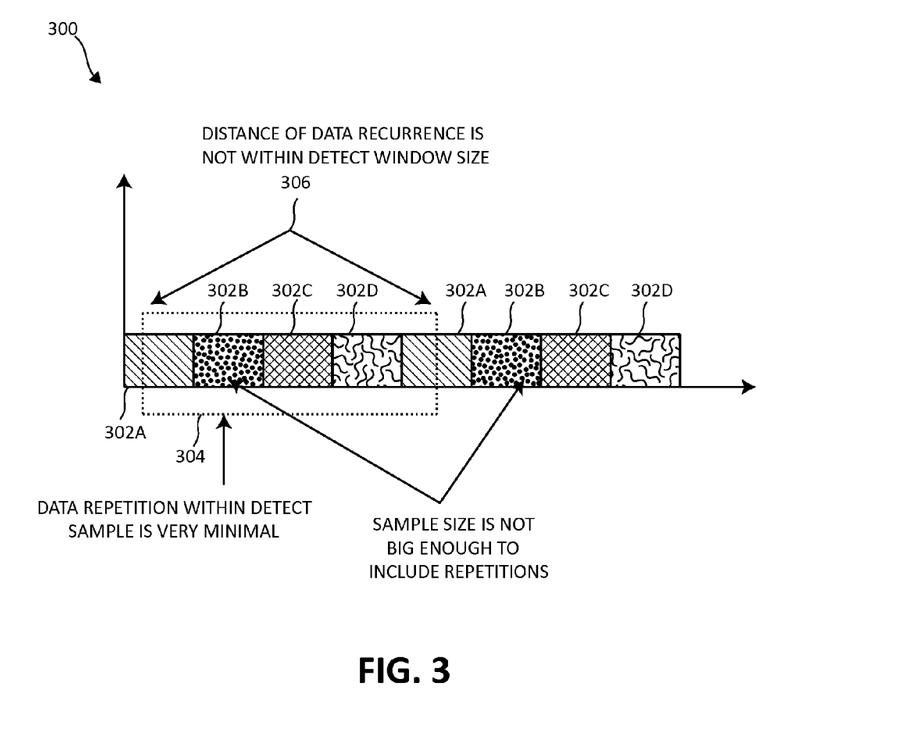
FIG. 3 is a block diagram illustrating a incorrect compression detection decisions for repeated data.
Figure 4:
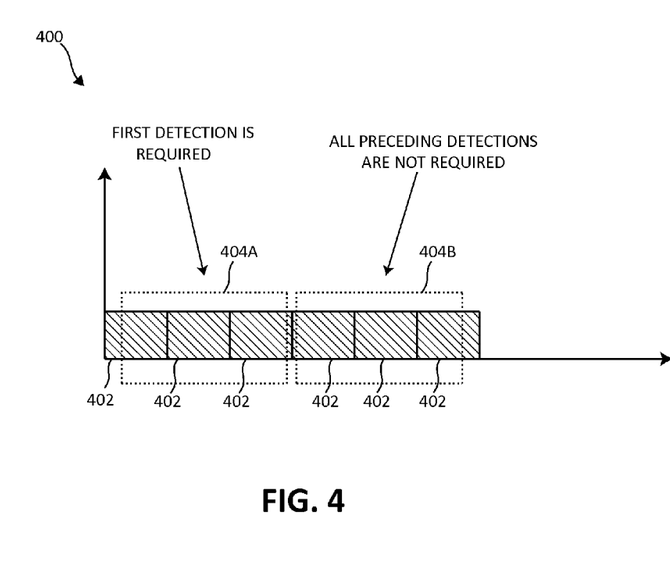
FIG. 4 is a block diagram illustrating repeated compression detection operations on homogeneous data.

As mentioned above, a compression detection method may be used to determine data that cannot be compressed or that compression will reduce the data by a very small amount and skip compression for this data. Unfortunately, incorrect detection decisions can lead to significant compression reduction and storage system inefficiency, as further illustrated below in FIGS. 3 and 4. FIG. 3 is a block diagram 300 illustrating a incorrect compression detection decisions for repeated data. As mentioned above, a need exists for controlling real-time compression detection using a processor device in a computing environment. As illustrated in FIG. 3, without a solution for controlling real-time compression detection, incorrect detection decisions may lead to significant compression reduction and storage system inefficiency. Data blocks 302 (illustrated as 302A-D) are repeated as shown in FIG. 3. However, the compression detection decision window 304 shows that the distance 306 of the size of the detection decision window 304 is inaccurate and the data repetition within the detect sample is very minimal. Also, the distance 306 of data recurrence is not within the detect window 304 size as seen with the first occurrence of data block 302A and the repeated occurrence of data block 302A not fully within the detect window 304 size. As observed, the sample size of the data blocks 302 (e.g., the first occurrence of 302A-D) is not large enough to include all of the data repetitions 302 (e.g., the second occurrence of 302A-D). Furthermore, repeated detection operations on homogeneous data may also lead to significant compression reduction and storage system inefficiency as illustrated in FIG. 4. FIG. 4 is a block diagram illustrating a repeated compression detection operations on homogeneous data. Repeated detection operations 404A and 404B on homogeneous data 402 shows a first detection operation 404A, which is required, but then a subsequent detection operation 404B is repeated on the data blocks 402, which is not required. All preceding detections, such as 404B, are not required. The repeated detection operations on homogeneous data is not needed or required and consumes significant computing resources.

To overcome the inefficiencies illustrated in FIG. 3 and FIG. 4, as described below in FIG. 5-8, a solution is provided for controlling real-time compression detection using a processor device in a computing environment. A detection learning module is used for enabling and/or disabling real-time compression detection by maintaining a history of real-time compression detection success for sampled data. The enabling or disabling of the real-time compression detection is based on a detection benefit function derived from a set of calculated heuristics indicating the real-time compression detection success on input streams.

In essence, the focus of the present invention is to (1) compute a set of heuristics indicating the success rate of the compression detection module on input streams; (2) compute a detection benefit function based on the heuristics; (3) use the compression detection only if a compression detection benefit function indicates that the data is above a given threshold; (4) compute a compression detection type histogram; and (5) update a detection interval in accordance to histogram segmentation (In other words if HS(n) is known detection is not required and detection interval can be adjusted in case the data is homogeneous).

Figure 5:
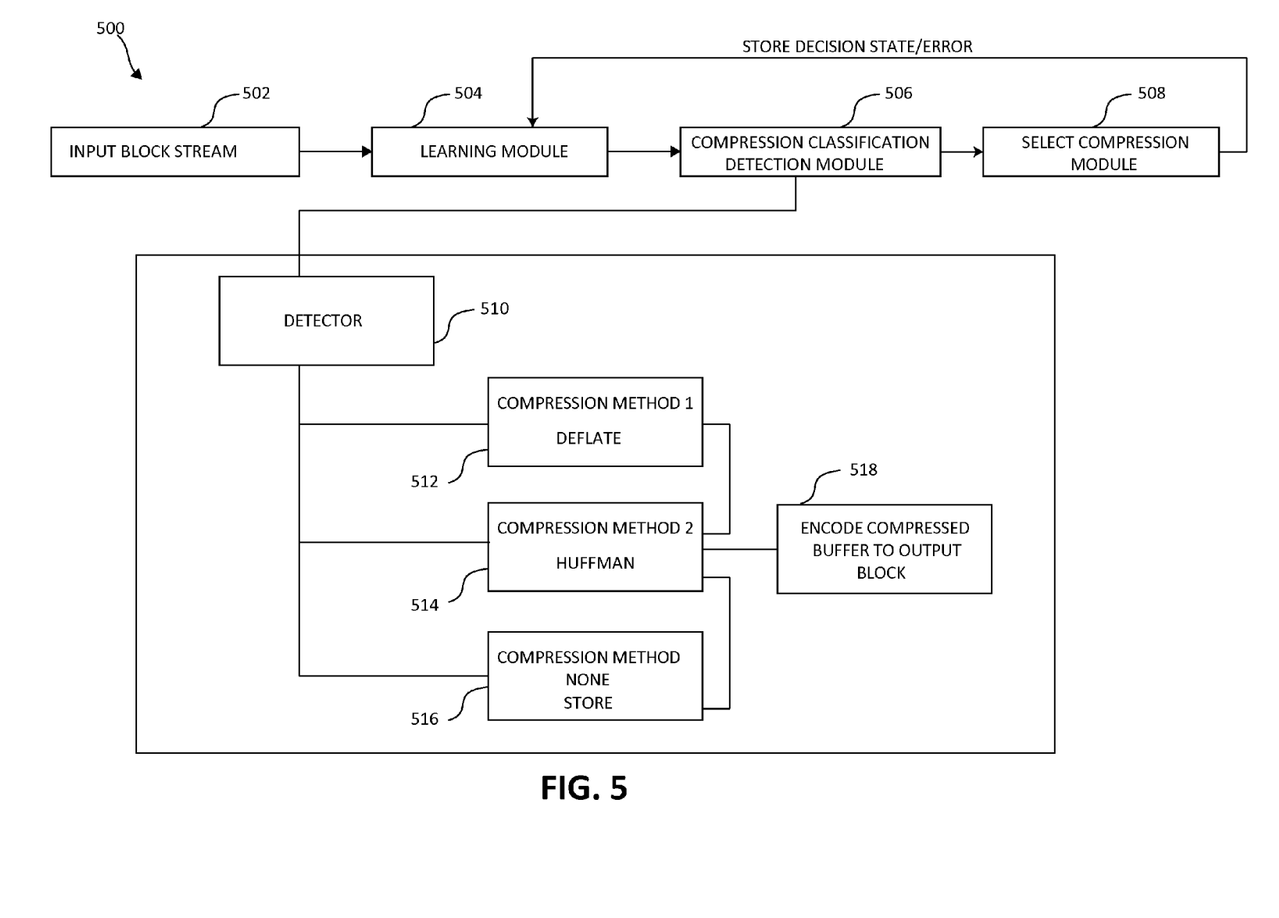
FIG. 5 is a flow chart diagram illustrating an exemplary method for controlling real-time compression detection using a classification learning module and a detection learning module in which aspects of the present invention may be realized.

FIG. 5 is a flow chart diagram illustrating an exemplary method 500 for controlling real-time compression detection using a classification learning module and a detection learning module in which aspects of the present invention may be realized. The method 500 begins with an input block data stream (e.g., a write block input) (step 502). The classification learning module (step 504) sends the input block stream to the compression classification detection learning module (e.g., the detection learning module) with the current status of the detection learning module (e.g., disabled detection learning module status and/or enabled detection learning module status) (step 506). If the status of the detection learning module is disabled, the input block data stream is compressed using a selected compression method that is set as the default compression method (step 508). However, if the status of the detection learning module is enabled when it receives the input block data stream, a detector is used to verify with the classification learning module (illustrated in step 504) if a full detection learning operation is required (step 510). The detector executes a full detection process when a sample histogram is not yet recognized. The full detection operation returns with the following states; a compress state, a store state, and/or a Huffman state, etc. The detector may also select the type of compression method to use. The detector may select a first compression method (deflate) for the input data stream (step 512). The detector may select a second compression method (Huffman) for the input data stream (step 514). The detector may also select no compression method for the input data stream and store the input data stream (step 516). The selected compression method may be used for compression. The selected compression method is stored in the learning module. Also, the error on the detection is also stored in the learning module (e.g., a decision state showing an error is stored in the learning module). The method 500 may also encode a compressed buffer to an output data block (step 518).

In one embodiment, the input data buffer may be an application file and/or a data block. The data sample interval can be: (1) the entire input buffer streams feed to the system, and/or (2) randomly selected (or predefined) sequences of data streams received from the input data buffer.

The heuristics, indicating the success rate of the compression detection module, used for determining whether to enable/disable the compression detection may include one or more of the following. (1) A success rate for compression detection: false detect calls are updated in cases where a compression benefit function indicate that the data is above a given threshold (e.g., a detection success threshold) but the compressed buffer benefit is below the given threshold (e.g., the detection success threshold). The compression benefit refers to the detection output where the compressed buffer benefit is the validating that the compressed buffer matches the detection output. For example, if the detection output is to be compressed than the compressed buffer should be compressed as well. (2) When the success rate for compression detection is below a success rate for compression detection threshold (e.g., the detection success threshold) the success rate for compression detection is disabled. In other words, if the detection benefit function indicates that the real-time compression detection success ratio for the sampled data is below a detection success threshold, the real-time compression detection is disabled. On the other hand, if the detection benefit function indicates that the real-time compression detection success ratio for the sampled data is above a detection success threshold, the real-time compression detection is enabled. (3) The success rate for compression detection is reset every configurable interval. For example, the configurable interval may be set as per write call/per output buffer/per segment and the like. (4) A detection type histogram is computed. The histogram is computed in order to generate the HS(n) for a given buffer stream. Interval of detection can be adjusted in accordance to HS(n). (5) The compression detection interval is updated in accordance to histogram segmentation.

For the purpose of speed optimization, the calculated heuristics, indicating the real-time compression detection success on input streams, may be calculated one after the other and based on a heuristic score. The detection benefit function can be computed based on some or all the heuristics score.

In one embodiment, the detection learning module function may be used by at least one or more of the following; (1) the detection learning module may always be used and an indication is provided for every detection; (2) the detection learning module may be used on demand when the compression ratio is below a given threshold for a predefined number of buffers/bytes, and then the detection learning module may be turned off (e.g., on demand) when the all or most of (e.g., at least 50% or more) of the data is compressible at a good ratio (e.g., the good ration is any ratio above a given predetermined threshold), and (3) the detection learning module may be used according to the size of the buffer—only for a given set of buffer sizes.

Figure 6:
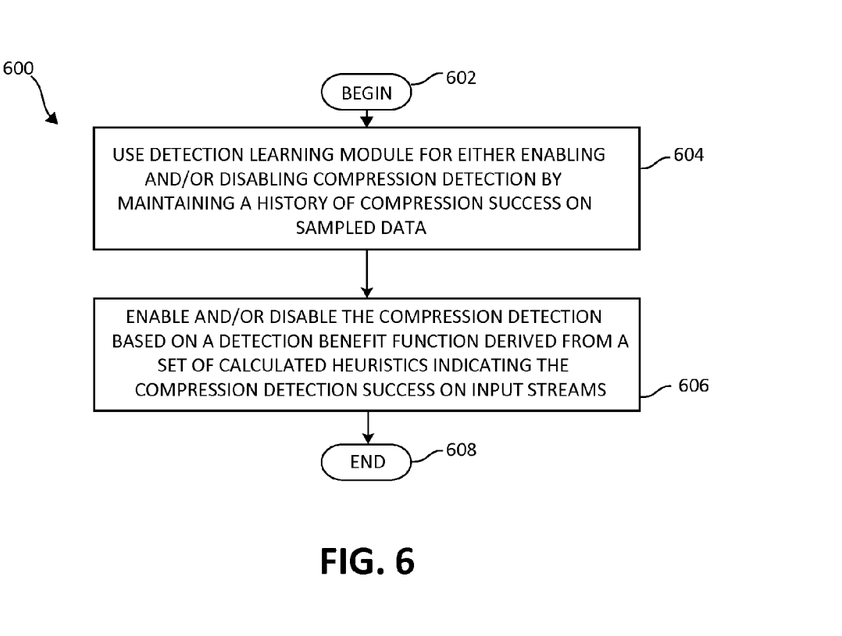
FIG. 6 is a flow chart diagram illustrating an exemplary alternative method for controlling real-time compression detection using a detection learning module in which aspects of the present invention may be realized.

FIG. 6 is a flow chart diagram illustrating an exemplary alternative method 600 for controlling real-time compression detection using a detection learning module in which aspects of the present invention may be realized. The method 600 begins (step 602) by using a detection learning module for either enabling and/or disabling real-time compression detection by maintaining a history of real-time compression detection success for sampled data (step 604). The method 600 enables or disables the real-time compression detection based on a detection benefit function derived from a set of calculated heuristics indicating the real-time compression detection success on input streams (step 606). The method 600 ends (step 608).

Figure 7:
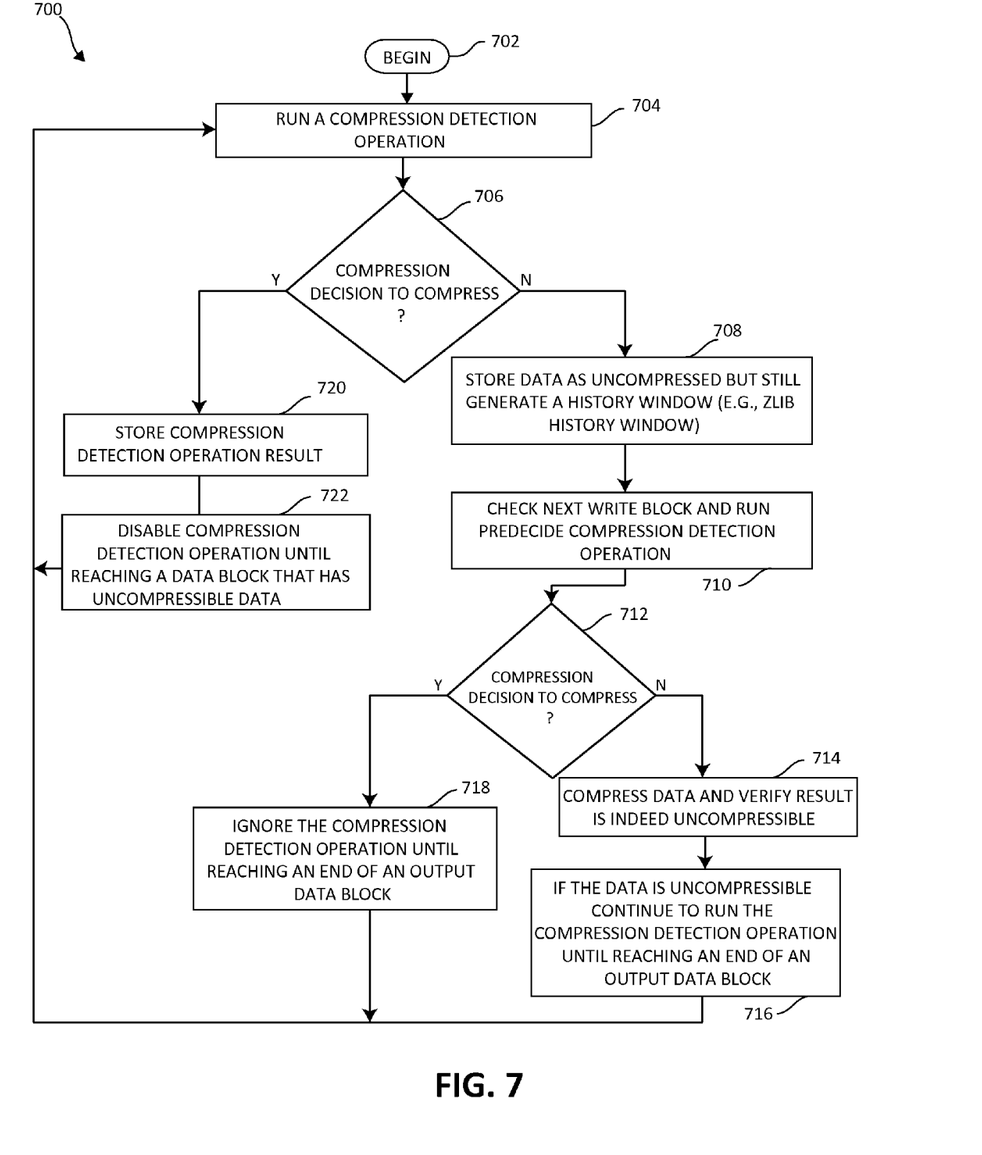
FIG. 7 is a flow chart diagram illustrating an exemplary alternative method for controlling real-time compression detection using a detection learning module in which aspects of the present invention may be realized.

FIG. 7 is a flow chart diagram illustrating an exemplary alternative method 700 for controlling real-time compression detection using a detection learning module in which aspects of the present invention may be realized. The method 700 begins (step 702), and runs a detection operation (e.g., a compression detection operation) on a sampled data block (e.g., a write block) (step 704). The method 700 decides and/or determines if a decision is made by the compression detection operation to compress the sampled data (e.g., the write block) (step 706). If no, the method 700 stores the data as uncompressed but also generates a history window (e.g., a ZLIB history window) (step 708). The method 700 then checks the next write block (e.g., a next sample of data) and runs the compression detection operation (step 710). The method 700 decides and/or determines if a decision is made by the compression detection operation to compress the next sampled data (e.g., the next write block) (step 712). If yes, the method 700 ignores the compression detection operation until reaching an end of an output data block (step 718). The method 700 returns to step 704. If the decision is not to compress (at step 712), the method 700 compresses the data and verifies if the result is indeed uncompressible (e.g., verify the results from compressing the data that the data is not compressible and/or verify the accuracy of the decision not to compresses by actually compressing the data and determining if the data is actually uncompressible) (step 714). If the data is uncompressible, the method 700 continues to run the compression detection operation until reaching an end of an output data block (step 716). The method 700 returns to step 704. Returning to step 706, if the decision is to compress the data, the method 700 stores the compression detection operation result (e.g., maintains a history of real-time compression detection decisions and success rates for sampled data) (step 720). The method 700 disables the compression detection operation until a data block that contains uncompressible data is reached (step 722). The method 700 returns to step 704.

Figure 8:
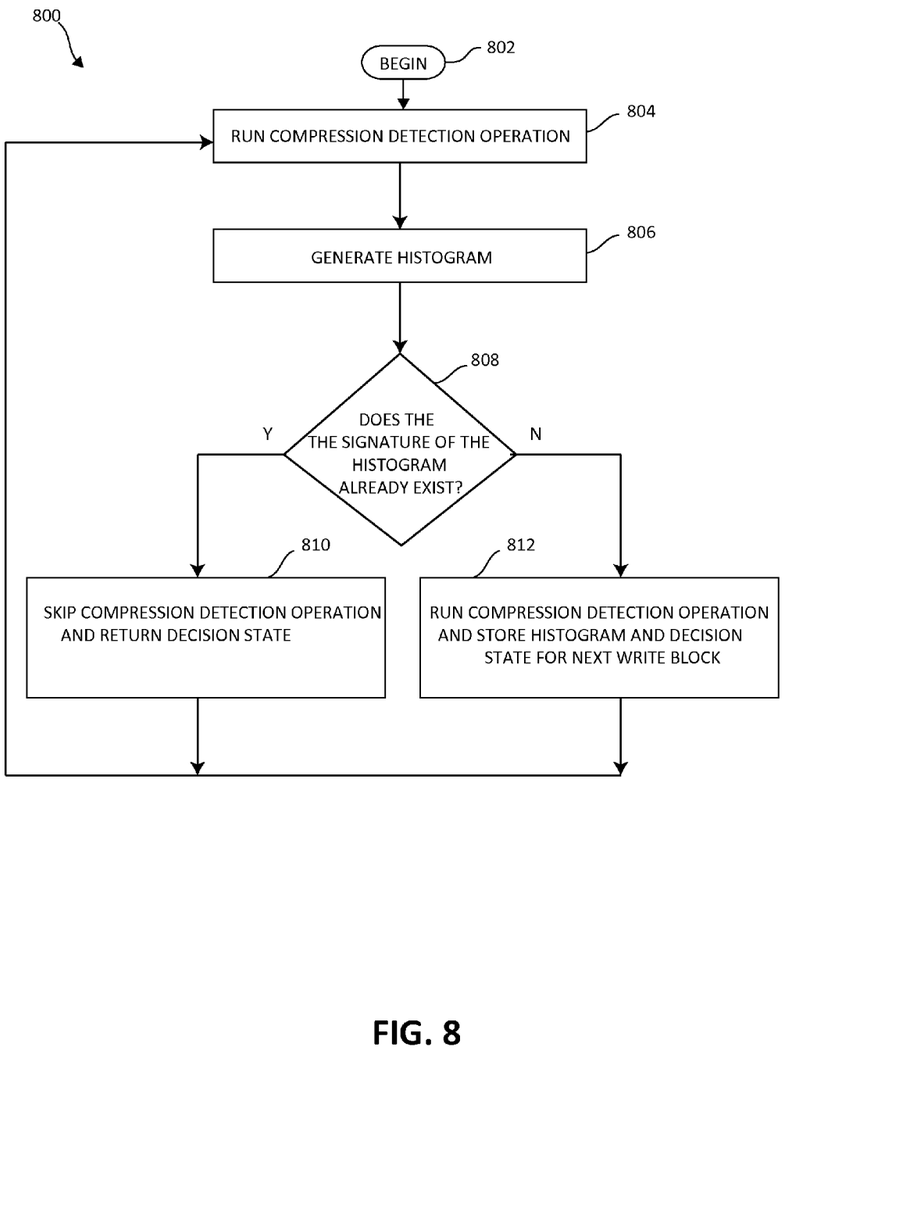
FIG. 8 is a flow chart diagram illustrating an exemplary method for eliminating a re-detection using the detection learning module on a sample of data in which aspects of the present invention may be realized.

FIG. 8 is a flow chart diagram illustrating an exemplary method 800 for eliminating a re-detection using the detection learning module on a sample of data in which aspects of the present invention may be realized. The method 800 begins (step 802) by running a compression detection operation using a detection learning module for one of enabling and disabling real-time compression detection (step 804). The method 800 generates (e.g., calculates) a histogram (e.g., detection histogram) (step 806). In order to minimize repeated detection calls on the sample of data, the method 800 determines if a signature of the calculated histogram matches a signature of a histogram that already exists (step 808). In other words, each generated detection histogram signature is stored and divided by N most frequent detection histogram values with the N most frequent detection histogram values corresponding decision states (e.g., state of enabled or state of disabled). In other words, each generated detection histogram signature (HS) is stored and divided by N most frequent detection histogram values with the N most frequent detection histogram values corresponding decision states. This means HS(n) is generated for each detection in order to prevent re-detection of blocks with similar HS(n). So the way in which HS(n) is generated is by computing the histogram of the input data and store only the most frequent histogram values (e.g., n=1 . . . 256). Therefore, for example, two blocks with similar HS(n) signature will not required executing a detection operation and the present invention may disable it for all these cases. If yes, method 800 skips the compression detection operation and returns the decision state (step 810). If no, the method 800 runs the compression detection operation and stores the detection histogram and the decision state for the next write block (step 812). The method 800 returns to step 804 for both steps 810 and 812. In the detection process, in case a signature of the calculated histogram for a current write block data sample matches an existing signature of a histogram a previous write block data sample, the detection is returned with the previous state without any further detection processing.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for controlling real-time compression detection by a processor device in a computing environment, the method comprising:
    using a detection learning module for one of enabling and disabling real-time compression detection by maintaining a history of real-time compression detection success for sampled data;
    enabling or disabling the real-time compression detection based on a detection benefit function derived from a set of calculated heuristics indicating the real-time compression detection success on input streams;
    calculating the detection benefit function based on at least one heuristic score;
    calculating a real-time compression detection histogram; and
    updating a real-time compression detection interval according to a real-time compression detection histogram.

2. The method of claim 1, further including disabling the real-time compression detection if the detection benefit function indicates that the real-time compression detection success for the sampled data is below a detection success threshold.

3. The method of claim 2, further including enabling the real-time compression detection if the detection benefit function indicates that the real-time compression detection success for the sampled data is above a detection success threshold.

4. The method of claim 3, further including updating false detect calls where the detection benefit function indicates that the sampled data is above the detection success threshold but a compressed buffer benefit is below a compression buffer benefit threshold.

5. The method of claim 1, further including calculating each of the calculated heuristics one after another, wherein a heuristic score is computed for each of the calculated heuristics.

6. The method of claim 1, further including using the detection learning module by one of:
    providing an indication for one of enabling and disabling real-time compression detection for each real-time compression detection,
    performing one of enabling and disabling real-time compression detection on demand when a compression ratio is below a predetermined threshold for a predefined number of buffers and bytes, wherein the detection learning module is turned off when a majority of data is compressible,
    performing one of enabling and disabling real-time compression detection according to one of a buffer size and set of buffer sizes.

7. The method of claim 1, further including performing at least one of:
    storing the sampled data as uncompressed while still generating a history window if the detection learning module indicates the data is uncompressible,
    checking a next write operation after storing the sampled data as uncompressed while still generating the history window,
    running the detection learning module if the detection learning module indicates the sampled data is uncompressible,
    compressing the sampled data and verifying an indication of the detection learning module that the data is uncompressible is accurate,
    running the detection learning module until reaching an end of an output block if the detection learning module indicates the data is uncompressible,
    ignoring the detection learning module until reaching the end of an output block if the detection learning module indicates the data is compressible,
    reactivating the detection learning module,
    storing a result of the real-time compression detection if the detection learning module indicates the data is compressible, and
    disabling the real-time compression detection until an uncompressed write operation is reached if the real-time compression detection indicates a real-time compression decision is dominant.

8. The method of claim 1, further including, for eliminating a real-time compression re-detection of the sampled data, performing at least one of:
    determining if a signature of the real-time compression detection histogram calculated for the sampled data matches an existing real-time compression detection histogram,
    skipping the real-time compression detection for the sampled data without any further real-time compression detection processing if the signature of the real-time compression detection histogram calculated for the sampled data matches an existing real-time compression detection histogram.

9. A system for controlling real-time compression detection in a computing environment, the system comprising:
    a detection learning module; and
    at least one processor device operable in the computing environment and in communication with the detection learning module, wherein the at least one processor device:
        uses the detection learning module for one of enabling and disabling real-time compression detection by maintaining a history of real-time compression detection success for sampled data,
        enables or disables the real-time compression detection based on a detection benefit function derived from a set of calculated heuristics indicating the real-time compression detection success on input streams,
        calculates the detection benefit function based on at least one heuristic score;
        calculates a real-time compression detection histogram, and
        updates a real-time compression detection interval according to a real-time compression detection histogram.

10. The system of claim 9, wherein the at least one processor device disables the real-time compression detection if the detection benefit function indicates that the real-time compression detection success for the sampled data is below a detection success threshold.

11. The system of claim 10, wherein the at least one processor device enables the real-time compression detection if the detection benefit function indicates that the real-time compression detection success for the sampled data is above a detection success threshold.

12. The system of claim 11, wherein the at least one processor device updates false detect calls where the detection benefit function indicates that the sampled data is above the detection success threshold but a compressed buffer benefit is below a compression buffer benefit threshold.

13. The system of claim 9, wherein the at least one processor device calculates each of the calculated heuristics one after another, wherein a heuristic score is computed for each of the calculated heuristics.

14. The system of claim 9, wherein the at least one processor device uses the detection learning module by one of:
    providing an indication for one of enabling and disabling real-time compression detection for each real-time compression detection,
    performing one of enabling and disabling real-time compression detection on demand when a compression ratio is below a predetermined threshold for a predefined number of buffers and bytes, wherein the detection learning module is turned off when a majority of data is compressible,
    performing one of enabling and disabling real-time compression detection according to one of a buffer size and set of buffer sizes.

15. The system of claim 9, wherein the at least one processor device performs at least one of:
    storing the sampled data as uncompressed while still generating a history window if the detection learning module indicates the data is uncompressible,
    checking a next write operation after storing the sampled data as uncompressed while still generating the history window,
    running the detection learning module if the detection learning module indicates the sampled data is uncompressible,
    compressing the sampled data and verifying an indication of the detection learning module that the data is uncompressible is accurate,
    running the detection learning module until reaching an end of an output block if the detection learning module indicates the data is uncompressible,
    ignoring the detection learning module until reaching the end of an output block if the detection learning module indicates the data is compressible,
    reactivating the detection learning module,
    storing a result of the real-time compression detection if the detection learning module indicates the data is compressible, and
    disabling the real-time compression detection until an uncompressed write operation is reached if the real-time compression detection indicates a real-time compression decision is dominant.

16. The system of claim 9, wherein the at least one processor device, for eliminating a real-time compression re-detection of the sampled data, performs at least one of:
    determining if a signature of the real-time compression detection histogram calculated for the sampled data matches an existing real-time compression detection histogram,
    skipping the real-time compression detection for the sampled data without any further real-time compression detection processing if the signature of the real-time compression detection histogram calculated for the sampled data matches an existing real-time compression detection histogram.

17. A computer program product for controlling real-time compression detection by a processor device, the computer program product comprising a non-transitory computer-readable storage medium having computer-readable program code portions stored therein, the computer-readable program code portions comprising:
    a first executable portion that uses a detection learning module for one of enabling and disabling real-time compression detection by maintaining a history of real-time compression detection success for sampled data;
    a second executable portion that enables or disables the real-time compression detection based on a detection benefit function derived from a set of calculated heuristics indicating the real-time compression detection success on input streams;
    a third executable portion that calculates the detection benefit function based on at least one heuristic score;
    a fourth executable portion that calculates a real-time compression detection histogram; and
    a fifth executable portion that updates a real-time compression detection interval according to a real-time compression detection histogram.

18. The computer program product of claim 17, further including a sixth executable portion that disables the real-time compression detection if the detection benefit function indicates that the real-time compression detection success for the sampled data is below a detection success threshold.

19. The computer program product of claim 18, further including a seventh executable portion that enables the real-time compression detection if the detection benefit function indicates that the real-time compression detection success for the sampled data is above a detection success threshold.

20. The computer program product of claim 19, further including an eighth executable portion that updates false detect calls where the detection benefit function indicates that the sampled data is above the detection success threshold but a compressed buffer benefit is below a compression buffer benefit threshold.

21. The computer program product of claim 17, further including a sixth executable portion that calculates each of the calculated heuristics one after another, wherein a heuristic score is computed for each of the calculated heuristics.

22. The computer program product of claim 17, further including a sixth executable portion that uses the detection learning module by one of:
    providing an indication for one of enabling and disabling real-time compression detection for each real-time compression detection,
    performing one of enabling and disabling real-time compression detection on demand when a compression ratio is below a predetermined threshold for a predefined number of buffers and bytes, wherein the detection learning module is turned off when a majority of data is compressible,
    performing one of enabling and disabling real-time compression detection according to one of a buffer size and set of buffer sizes.

23. The computer program product of claim 17, further including a sixth executable portion that performs at least one of:
- storing the sampled data as uncompressed while still generating a history window if the detection learning module indicates the data is uncompressible,
- checking a next write operation after storing the sampled data as uncompressed while still generating the history window,
- running the detection learning module if the detection learning module indicates the sampled data is uncompressible,
- compressing the sampled data and verifying an indication of the detection learning module that the data is uncompressible is accurate,
- running the detection learning module until reaching an end of an output block if the detection learning module indicates the data is uncompressible,
- ignoring the detection learning module until reaching the end of an output block if the detection learning module indicates the data is compressible,
- reactivating the detection learning module,
- storing a result of the real-time compression detection if the detection learning module indicates the data is compressible, and
- disabling the real-time compression detection until an uncompressed write operation is reached if the real-time compression detection indicates a real-time compression decision is dominant.

24. The computer program product of claim 17, further including a sixth executable portion that, for eliminating a real-time compression re-detection of the sampled data, performs at least one of:
- determining if a signature of the real-time compression detection histogram calculated for the sampled data matches an existing real-time compression detection histogram,
- skipping the real-time compression detection for the sampled data without any further real-time compression detection processing if the signature of the real-time compression detection histogram calculated for the sampled data matches an existing real-time compression detection histogram.

* * * * *